United States Patent [19]

Baliga

[11] Patent Number: 5,270,244
[45] Date of Patent: Dec. 14, 1993

[54] METHOD FOR FORMING AN OXIDE-FILLED TRENCH IN SILICON CARBIDE

[75] Inventor: Bantval J. Baliga, Raleigh, N.C.

[73] Assignee: North Carolina State University at Raleigh, Raleigh, N.C.

[21] Appl. No.: 8,766

[22] Filed: Jan. 25, 1993

[51] Int. Cl.$^5$ .............................................. H01L 21/76
[52] U.S. Cl. ...................................... 437/67; 437/26;
437/25; 437/24; 437/69; 437/940; 437/100;
148/DIG. 148
[58] Field of Search ..................... 437/26, 24, 25, 38,
437/940, 69, 67, 100; 148/DIG. 2, DIG. 148,
DIG. 50, DIG. 1

[56] References Cited

U.S. PATENT DOCUMENTS

| | | | |
|---|---|---|---|
| 3,982,262 | 9/1976 | Karatsjuba et al. | 437/24 |
| 4,161,743 | 7/1979 | Yonezawa et al. | 257/636 |
| 4,532,149 | 7/1985 | McHargue | 427/527 |
| 4,757,028 | 7/1988 | Kondoh et al. | 437/100 |
| 4,994,413 | 2/1991 | Eshita | 437/100 |
| 5,030,580 | 7/1991 | Furukawa et al. | 437/24 |
| 5,087,576 | 2/1992 | Edmond et al. | 437/100 |

OTHER PUBLICATIONS

Trew, Yan and Mock, "The Potential of Diamond and SiC Electronic Devices for Microwave and Millimeter-Wave Power Applications," Proceedings of the IEEE, vol. 79, No. 5, pp. 598–620, May, 1991.
Bhatnagar and Baliga, "Analysis of Silicon Carbide Power Device Performance", IEEE, pp. 176–180, 1991.
Pan and Steckl, "Reactive Ion Etching of SiC Thin Films by Mixtures of Fluorinated Gases and Oxygen", J. Electrochem. Soc., vol. 137, No. 1, pp. 212–220, Jan. 1990.
Davis, "Epitaxial Growth and Doping of and Device Development in Monocrystalline β-SiC Semiconductor Thin Films," Thin Solid Films, vol. 181, pp. 1–15, Dec. 1989.
Shenai, Scott and Baliga, "Optimum Semiconductors for High-Power Electronics", IEEE Transactions on Electron Devices, vol. 36, No. 9, pp. 1811–1823, Sep. 1989.
Bumgarner, Kong, and Kim, et al., "Monocrystalline β-SiC Semiconductor Thin Films: Epitaxial Growth, Doping, and FET Device Development," 1988 Proceedings of the 38th Electronics Components Conf., pp. 342–349, 1988.
Daimon, Yamanaka, Shinohara, Sakuma, Misawa, Endo and Yoshida, "Operation of Schottky-Barrier Field Effect Transistors of 3C-SiC up to 400° C.", Appl. Phys. Lett., vol. 51, pp. 2106–2108, Dec. 1987.
Kelner, Binari, Sleger and Kong, "β-SiC MESFET's and Buried Gate JFET's", IEEE Electron Device Letters, vol. EDL-8, No. 9, pp. 428–430, Sep. 1987.

(List continued on next page.)

Primary Examiner—Brian E. Hearn
Assistant Examiner—Trung Dang
Attorney, Agent, or Firm—Bell, Seltzer, Park & Gibson

[57] ABSTRACT

A method for forming an oxide-filled trench in silicon carbide includes the steps of amorphizing a portion of a monocrystalline silicon carbide substrate to thereby define an amorphous silicon carbide region in the substrate and then oxidizing the amorphous region to thereby form an oxide-filled trench in the substrate. Because of the enhanced rate of oxidation in the amorphous region as compared to the rate of oxidation of the surrounding monocrystalline silicon carbide regions at relatively low temperatures, the oxide-filled trench is generally defined by the lateral and vertical dimensions of the amorphous silicon carbide region. The amorphizing step includes the steps of masking an area on the face on the monocrystalline silicon carbide substrate to thereby expose a portion of the substrate wherein the amorphous region is to be formed and then directing ions to the face, such that the ions implant into the exposed portion of the substrate and create an amorphous silicon carbide region therein. The implanted ions are preferably selected from the group consisting of silicon, hydrogen, neon, helium, carbon and argon.

7 Claims, 1 Drawing Sheet

OTHER PUBLICATIONS

Kong, Palmour, Glass and Davis, "Temperature Dependence of the Current-Voltage Characteristics of Metal-Semiconductor . . . Via Chemical Vapor Deposition", Appl. Phys. Lett., vol. 51, pp. 442-444, Aug. 1987.

Kelner, Binari, Sleger and Kong, "β-SiC MESFETs", Mater. Res. Soc. Symp. Proc., vol. 97, pp. 227-232, Sep. 1987.

Edmond, Palmour, and Davis, "Chemical Etching of Ion Implanted Amorphous Silicon Carbide," J. Electrochem. Soc.: Solid-State Science and Technology, pp. 650-652, Mar. 1986.

Sugiura, Lu, Cadien and Steckl, "Reactive Etching of SiC Thin Films Using Fluorinated Gases", J. Vac. Sci. Technology. B 4 (1), pp. 349-355, Jan.-Feb. 1986.

Chang, Fang, Huong, and Wu, "Noval Passivation Dielectrics-The Boron- or Phosphorus-Doped Hydrogenated Amorphous Silicon Carbide Films", J. Electrochem. Soc.: Solid State Science and Technology, pp. 418-422, Feb. 1985.

McHargue, Lewis, Williams and Appleton, "The Reactivity of Ion-Implanted SiC", Materials Science and Engineering, vol. 69, pp. 391-395, 1985.

Palmour, Davis, Astell-Burt and Blackborow, "Effects of Cathode Materials and Gas Species on the Surface Characteristics of Dry Etched Monocrystalline Beta-SiC Thin Films", Silicon Carbide, pp. 491-550.

METHOD FOR FORMING AN OXIDE-FILLED TRENCH IN SILICON CARBIDE

CROSS REFERENCE TO RELATED APPLICATIONS

This application is related to Application Ser. No. 08/008,719, entitled METHOD OF FORMING TRENCHES IN MONOCRYSTALLINE SILICON CARBIDE; application Ser. No. 08/008,747, entitled SILICON CARBIDE FIELD EFFECT TRANSISTOR AND METHOD OF FABRICATING SAME; and application Ser. No. 08/008,203, entitled METHOD FOR FORMING A P-N JUNCTION IN SILICON CARBIDE, AND P-N JUNCTION FORMED THEREBY; all filed concurrently herewith, the disclosures of which are hereby incorporated by reference.

FIELD OF THE INVENTION

The present invention relates to microelectronic devices and manufacturing methods, and more particularly to methods for forming electronic devices in silicon carbide.

BACKGROUND OF THE INVENTION

As is well known to those having skill in the art, monocrystalline silicon carbide is particularly well suited for use in semiconductor devices, such as integrated circuit semiconductor devices and power semiconductor devices. Integrated circuit semiconductor devices typically include many active devices such as transistors in a single semiconductor substrate. Power semiconductor devices, which may be integrated circuit devices, are semiconductor devices which carry large currents and support high voltages.

Silicon carbide has a wide bandgap, a high melting point, a low dielectric constant, a high breakdown field strength, a high thermal conductivity and a high saturated electron drift velocity compared to silicon, which is the most commonly used semiconductor material. These characteristics allow silicon carbide microelectronic devices to operate at higher temperatures and higher power levels than conventional silicon based devices. In addition to the above advantages, silicon carbide power devices can operate with lower specific on-resistance than conventional silicon power devices. Some of the advantages of using silicon carbide for forming power semiconductor devices are described in articles by K. Shenai, R. S. Scott, and inventor B. J. Baliga, entitled *Optimum Semiconductors for High-Power Electronics*, IEEE Transactions on Electron Devices, Vol. 36, No. 9, pp. 1811–1823 (1989); and by M. Bhatnagar and inventor B. J. Baliga entitled *Analysis of Silicon Carbide Power Device Performance*, ISPSD '91, Abstr. 8.3, pp 176–180 (1991).

Many of the processes for forming microelectronic devices require the formation of insulating regions, such as oxides, that act as masks for device processing, perform the function of electrically isolating one or more regions of a semiconductor device from one another, and insulate adjacent semiconductor devices on a semiconductor substrate from each other. Conventional techniques for forming insulating regions on silicon include thermal oxidation, low pressure chemical vapor deposition (LPCVD) and plasma-assisted deposition. As will be understood by one skilled in the art, thermal oxidation is probably the most common technique used to grow high quality oxides, such as those made of $SiO_2$, on silicon substrates.

In addition to the numerous techniques for forming oxides on silicon, thermal oxidation of silicon carbide has also been investigated. For example, in an article by J. W. Bumgarner, H. S. Kong, H. J. Kim, J. W. Palmour, J. A. Edmond, J. T. Glass, and R. F. Davis, entitled *Monocrystalline β-SiC Semiconductor Thin Films: Epitaxial Growth, Doping and FET Device Development*, 1988 Proc. 38th Electronics Components Conf., pp. 342–349, a depletion-mode MOSFET including a 430Å thermally grown gate oxide was produced. The gate oxide was grown at a temperature of 1273 degrees Centigrade (1473K) and required ninety (90) minutes in a flowing $O_2$ ambient. Similarly, in an article by R. F Davis, entitled *Epitaxial Growth and Doping of and Device Development in Monocrystalline β-SiC Semiconductor Thin Films*, Thin Solid Films, vol. 181, pp. 1–15, (1989), a 500Å gate oxide was obtained after oxidizing P-type β-SiC samples at 1273 degrees Centigrade (1473K) for thirty-six (36) minutes.

Notwithstanding these attempts at growing thin gate oxide layers on silicon carbide substrates, however, the formation of substantially thick oxides on the order of 5000–10,000Å, using growth techniques at temperatures below 1200 degrees Centigrade (1473K), has not heretofore been achieved. Such thick oxides are used, for example, to electrically insulate regions of a device using oxide layers and for electrically insulating adjacent devices from each other using oxide-filled trenches. Thick oxides are particularly important for power devices to prevent electric arcing or field oxide breakdown, between regions of a device or between adjacent devices, when such devices are operated in the presence of high electric fields and at high current levels.

SUMMARY OF THE INVENTION

It is therefore an object of the present invention to provide an improved method of forming an insulating region on a silicon carbide substrate.

It is another object of the present invention to provide a method for forming an oxide-filled region in a silicon carbide substrate.

These and other objects are provided, according to the present invention, by forming an oxide-filled region in a silicon carbide substrate by amorphizing a portion of the substrate wherein the oxide is to be formed prior to the formation of the oxide in the amorphized region. In particular, an area on the face of the monocrystalline substrate is first masked to thereby expose the portion of the substrate corresponding to the region wherein the oxide-filled region is to be formed. Next, ions are directed to the face such that the ions implant into the exposed portion and create an amorphous silicon carbide region of predetermined thickness in the substrate.

The thickness of the amorphous region preferably corresponds to the thickness of the oxide-filled region to be formed. Similarly, the lateral dimensions of the amorphous region correspond to the lateral dimensions of the oxide-filled region. As will be understood by one skilled in the art, the ion implanting step causes the formation of an amorphous region having a bottom, defined by a bottom edge, and sidewalls that extend substantially orthogonal from the bottom edge to the face of the substrate.

The ion implanting step preferably comprises the step of directing ions to the face. Although electrically active ions with respect to silicon carbide can be used, electrically inactive ions, such as those selected from the group consisting of silicon, hydrogen, neon, helium, carbon and argon are preferred. During the ion implanting step, each implanted ion undergoes scattering events with electrons and atoms in the exposed portion of the substrate. These scattering events cause point defects and amorphous disorder zones and reduce the ion's total energy until the ion comes to rest at some point below the surface of the substrate. The point defects and amorphous disorder zones are characterized by a relatively high concentration of dangling bonds as compared to the surrounding monocrystalline regions. While not wishing to be bound by any theory, it is believed that the presence of the dangling bonds in the amorphous region causes the implanted region to be more chemically reactive than the adjacent monocrystalline silicon carbide and makes thermal oxidation of silicon carbide to obtain thick oxides feasible.

As will be understood by one skilled in the art, regardless of whether the mask for defining the oxide-filled region to be formed is removed before or after the thermal oxidation step, a portion of the oxide formed in the amorphous region will typically extend above the face of the original silicon carbide substrate. This is because during the oxidation process, the $SiC-SiO_2$ interface moves into the amorphous silicon carbide region; however, it is believed that there is an overall volume expansion as the $O_2$ replaces the outdiffusing C. This results in the external $SiO_2$ surface not being coplanar with the original SiC surface. Accordingly, the steps of amorphizing a silicon carbide region and forming an oxide on the region can also be used to create a vertically walled oxide pedestal capable of electrically insulating adjacent devices or structures on the surface of the silicon carbide substrate.

Because an amorphizing step is first performed to define the region wherein the oxidation is to take place, the kinetics of oxidation are enhanced and substantially thick oxide regions and oxide-filled trenches on the order of 5000-10,000Å can be achieved at temperatures in the range of 1173-1473K.

DESCRIPTION OF PREFERRED EMBODIMENTS

Figure 1A:
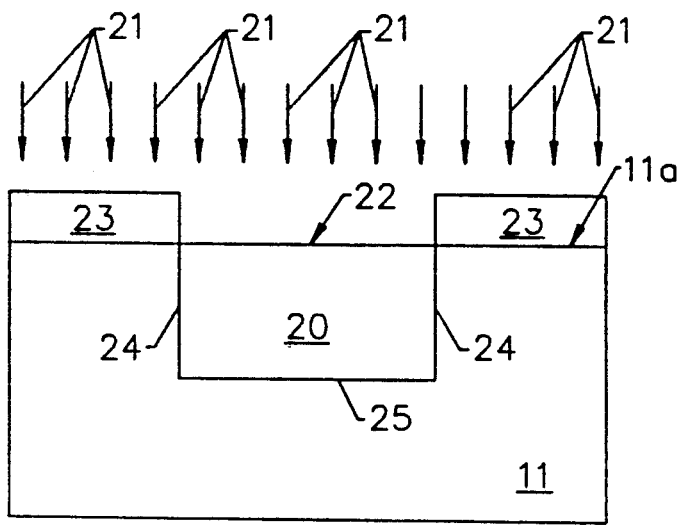
FIGS. 1A-1C are cross-sectional side views of a monocrystalline silicon carbide substrate during intermediate processing steps for forming an oxide-filled trench in a silicon carbide substrate.

The present invention now will be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout.

Figure 1B:
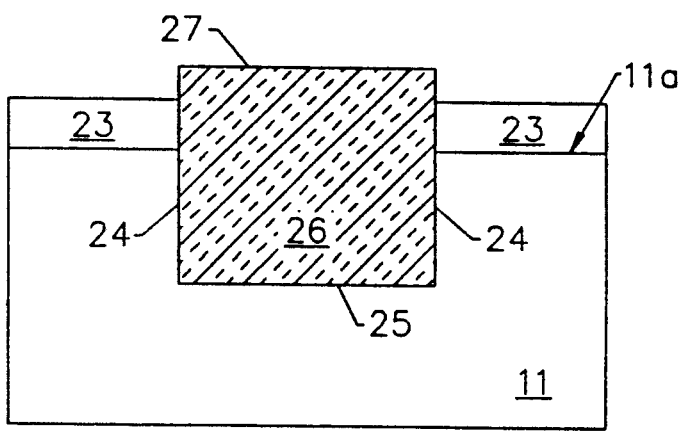
Figure 1C:
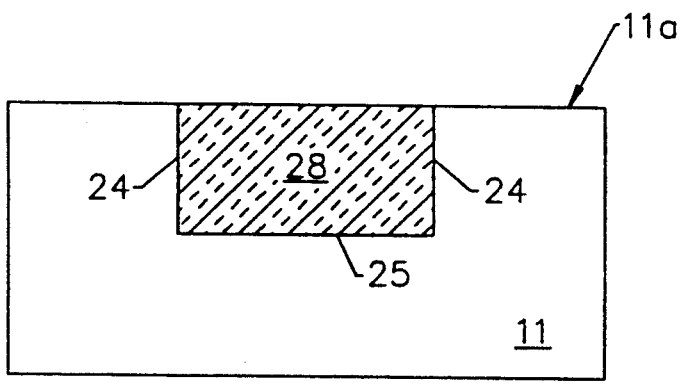

Referring now to FIGS. 1A-1C, a method for forming an oxide-filled trench in a silicon carbide substrate will now be described. As shown in FIG. 1A, a monocrystalline silicon carbide substrate 11 having a face 11a is provided. The first step includes a step for amorphizing a portion of the monocrystalline silicon carbide substrate 11 to thereby define an amorphous silicon carbide region in the monocrystalline silicon carbide substrate 11. The amorphizing step preferably includes the steps of masking an area on the face 11a to thereby expose a portion of the substrate 22 corresponding to the lateral dimensions of the amorphous region to be formed. The masking layer 23 can be formed of a single photoresist layer but preferably comprises a thin layer of $Si_3N_4$ and a layer of photoresist thereon. Next, ions 21 are directed to the face 11a, such that the ions implant into the exposed portion 22 and create an amorphous silicon carbide region 20 in the monocrystalline silicon carbide substrate 11. Because of the physical properties of ion implantation, the amorphous silicon carbide region 20 will be defined generally by a bottom edge 25 and sidewalls 24, extending substantially orthogonal from the edge 25 to the face 11a.

Preferably, the ions 21 implanted during the amorphizing step are electrically inactive, with respect to silicon carbide. The TABLE below illustrates some of the electrically inactive ions which can be used, and the dose required to produce the desired depth of the amorphized region 20 at 200 keV energy. It will be understood by those having skill in the art that lighter ions such as hydrogen typically penetrate the substrate to a greater depth than heavier ions such as argon, for a given implant dose. Multiple implants at different energies may also be used in order to obtain a uniform amorphous region having the desired depth.

| Implanted Ion | Depth of Amorphous Region (Å) | Dose (cm$^{-2}$) |
| --- | --- | --- |
| Ar++ | 5000 | 6E14 |
| Ar+ | 2100 | 4.8E14 |
| C+ | 6000 | 7E15 |
| He+ | 9000 | 1E17 |
| Si+ | 2800 | 8E14 |
| H+ | 15,000 | 2E18 |
| Ne+ | 4000 | 2E15 |

Referring now to FIG. 1B, the amorphizing step is followed by the step of oxidizing the amorphous region 20 to thereby form an oxide-filled region 26 in the silicon carbide substrate 11. The oxidation of the amorphous silicon carbide region is preferably performed in an oxygen ambient and can be performed at temperatures in the range of 1173K-1473K. Because of the volume expansion caused by the formation of the $SiO_2$ in the amorphous region, the top face 27 of the oxide-filled region 26 will typically be above the face 11a of the monocrystalline silicon carbide substrate 11.

As will be understood by one skilled in the art, because the lateral dimensions of the amorphous region 20 are defined by the pattern of the mask 23 and because the oxidation rate of the amorphous region 20 is substantially enhanced, with respect to monocrystalline silicon carbide, the oxide-filled region 26 will have dimensions substantially coextensive with the originally formed amorphous region 20. In addition, the enhanced rate of thermal oxidation of the amorphous silicon carbide region provides for substantial oxide growth even at temperatures in the temperature range of 1173 to 1473 Kelvin.

Referring now to FIG. 1C, the mask region 23 can be removed and the substrate 11 planarized, using conventional techniques, to provide a silicon carbide substrate having a oxide-filled trench 28 having a bottom edge and sidewalls defined generally by edge 25 and sidewalls 24, respectively. Alternatively, the mask region 23 can be removed and the oxide-filled region 26 retained in order to provide a oxide pedestal on the face of the silicon carbide substrate.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed:

1. A method for forming an oxide-filled region in a monocrystalline silicon carbide substrate comprising the steps of:
    masking an area on the face of a monocrystalline silicon carbide substrate to thereby expose a portion of said substrate corresponding to the lateral dimensions of the oxide-filled region to be formed;
    directing electrically inactive ions to the face, such that the electrically inactive ions implant into said portion and create an amorphous silicon carbide region of predetermined thickness in said substrate; and
    oxidizing said amorphous region to thereby obtain an oxide-filled region in said substrate.

2. A method for forming an oxide-filled region in a monocrystalline silicon carbide substrate comprising the steps of:
    masking an area on the face of a monocrystalline silicon carbide substrate to thereby expose a portion of said substrate corresponding to the lateral dimensions of the oxide-filled region to be formed;
    directing ions to the face, such that the ions implant into said portion and create an amorphous silicon carbide region of predetermined thickness in said substrate; and
    oxidizing said amorphous region to thereby obtain an oxide-filled region in said substrate;
    wherein said ion directing step comprises the step of directing ions selected from the group consisting of silicon, hydrogen, neon, helium, carbon and argon to the face, such that the electrically inactive ions implant into said portion and create an amorphous silicon carbide region of predetermined thickness in said substrate, said predetermined thickness corresponding to the depth of the oxide-filled region to be formed.

3. The method of claim 2, wherein said oxidizing step comprises the step of oxidizing said amorphous region in an oxygen ambient at a preselected temperature in the range of 1173K to 1473K.

4. The method of claim 1, wherein said oxidizing step comprises the step of oxidizing said amorphous region to thereby obtain an oxide-filled trench in said substrate and an oxide region above said face.

5. A method for forming an oxide-filled trench in a monocrystalline silicon carbide substrate comprising the steps of:
    amorphizing a portion of a monocrystalline silicon carbide substrate to thereby define an amorphous silicon carbide region n said monocrystalline silicon carbide substrate, extending to a face thereof; and
    oxidizing said amorphous region to thereby form an oxide-filled trench in said substrate, said oxide-filled trench being defined by the lateral dimensions of said amorphous region;
    wherein said amorphizing step comprises the steps of:
    masking an area on the face of a monocrystalline silicon carbide substrate to thereby expose a portion of said substrate corresponding to the lateral dimensions of the oxide-filled trench to be formed; and
    directing electrically inactive ions to the face, such that the electrically inactive ions implant into said portion and create an amorphous silicon carbide region of predetermined thickness in said substrate, said amorphous silicon carbide region having a bottom, corresponding to the depth of the trench to be formed, and a sidewall, defining the lateral dimensions of the trench, said bottom defining a bottom edge and said sidewall extending substantially orthogonal from said bottom edge to the face.

6. A method for forming an oxide-filled trench in a monocrystalline silicon carbide substrate comprising the steps of:
    amorphizing a portion of a monocrystalline silicon carbide substrate to thereby define an amorphous silicon carbide region in said monocrystalline silicon carbide substrate, extending to a face thereof; and
    oxidizing amorphous region to thereby form an oxide-filled trench in said substrate, said oxide-filled trench being defined by the lateral dimensions of said amorphous region;
    wherein said amorphizing step comprises the steps of:
    masking an area on the face of a monocrystalline silicon carbide substrate to thereby expose a portion of said substrate corresponding to the lateral dimensions of the oxide-filled trench to be formed; and
    directing ions to the face, such that the ions implant into said portion and create an amorphous silicon carbide region of predetermined thickness in said substrate, said amorphous silicon carbide region having a bottom, corresponding to the depth of the trench to be formed, and a sidewall, defining the lateral dimensions of the trench, said bottom defining a bottom edge and said sidewall extending substantially orthogonal from said bottom edge to the face; and
    wherein said ion directing step comprises the step of directing ions selected from the group consisting of silicon, hydrogen, neon, helium, carbon and argon to the face, such that the electrically inactive ions implant into said portion and create an amorphous silicon carbide region of predetermined thickness in said substrate, said predetermined thickness corresponding to the depth of the oxide-filled trench to be formed.

7. The method of claim 6, wherein said oxidizing step comprises the step of oxidizing said portion in a oxygen ambient at a preselected temperature in the range of 1173K to 1473K.

* * * * *